United States Patent
Teh et al.

(10) Patent No.: US 10,014,842 B2
(45) Date of Patent: Jul. 3, 2018

(54) METHOD AND APPARATUS FOR IDENTIFYING AUDIO ACCESSORY THROUGH TWO PIN CONNECTION IN A TWO WAY RADIO

(71) Applicant: MOTOROLA SOLUTIONS, INC, Schaumburg, IL (US)

(72) Inventors: Kheng Shiang Teh, Bayan Lepas (MY); Cheah Heng Tan, Bayan Lepas (MY)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 701 days.

(21) Appl. No.: 14/228,903

(22) Filed: Mar. 28, 2014

(65) Prior Publication Data

US 2015/0280678 A1     Oct. 1, 2015

(51) Int. Cl.
  *H04R 5/04* (2006.01)
  *H03G 9/14* (2006.01)
  *H04B 1/3827* (2015.01)
  *H03G 3/30* (2006.01)
  *H03G 9/02* (2006.01)

(52) U.S. Cl.
  CPC ............ *H03G 9/14* (2013.01); *H03G 3/3026* (2013.01); *H03G 3/3089* (2013.01); *H03G 9/025* (2013.01); *H04B 1/3827* (2013.01); *H04R 5/04* (2013.01)

(58) Field of Classification Search
  CPC ......... H04R 5/04; H04R 5/033; H04R 25/305
  See application file for complete search history.

(56) References Cited

U.S. PATENT DOCUMENTS

| | | | | |
|---|---|---|---|---|
| 5,161,198 A | * | 11/1992 | Noble | H04R 3/00 330/124 R |
| 6,069,960 A | * | 5/2000 | Mizukami | H04R 5/04 381/120 |
| 6,321,278 B1 | * | 11/2001 | Phu | G06F 3/165 381/81 |
| 6,928,175 B1 | * | 8/2005 | Bader | G06F 3/165 381/123 |
| 7,270,554 B2 | | 9/2007 | Corey et al. | |
| 7,890,284 B2 | | 2/2011 | Patterson et al. | |
| 8,244,927 B2 | | 8/2012 | Chadbourne et al. | |

(Continued)

FOREIGN PATENT DOCUMENTS

EP    2317743 A1    5/2011

*Primary Examiner* — Duc Nguyen
*Assistant Examiner* — Taunya McCarty
(74) *Attorney, Agent, or Firm* — Barbara R. Doutre; Scott M. Garrett

(57) ABSTRACT

A method and apparatus for detecting the connection of an external audio accessory to an audio device via a two-wire audio jack includes providing a DC bias on the output of the audio circuit connected to the audio jack. The audio jack is such that, when a plug is inserted into the audio jack, the DC bias is removed from an internal routing pin of the audio jack. The change in DC voltage at the internal routing pin indicates connection of the external audio accessory. Furthermore, upon detection, the AC response of the external audio accessory can be determined, and used to select a set of audio settings to be applied to the audio components of the audio device to optimize the performance of the external audio accessory.

9 Claims, 5 Drawing Sheets

(56) References Cited

U.S. PATENT DOCUMENTS

| | | | |
|---|---|---|---|
| 8,412,268 B2 | 4/2013 | Inha et al. | |
| 8,452,428 B2 | 5/2013 | Kong et al. | |
| 2005/0053243 A1 | 3/2005 | Ganton | |
| 2005/0268000 A1 | 12/2005 | Carlson | |
| 2006/0123138 A1 | 6/2006 | Perdomo et al. | |
| 2007/0155332 A1 | 7/2007 | Burgan et al. | |
| 2010/0111315 A1* | 5/2010 | Kroman | H04R 25/305 381/60 |
| 2010/0272252 A1 | 10/2010 | Johnson et al. | |
| 2010/0322432 A1* | 12/2010 | Clemow | G10K 11/178 381/71.1 |
| 2012/0142225 A1 | 6/2012 | Hansson et al. | |
| 2012/0200172 A1 | 8/2012 | Johnson et al. | |
| 2014/0003616 A1* | 1/2014 | Johnson | H04R 29/001 381/74 |

\* cited by examiner

METHOD AND APPARATUS FOR IDENTIFYING AUDIO ACCESSORY THROUGH TWO PIN CONNECTION IN A TWO WAY RADIO

FIELD OF THE DISCLOSURE

The present disclosure relates generally to audio circuits for portable two-way radio devices, and more particularly to distinguishing between the audio power amplifier being coupled to an internal speaker or an external speaker accessory using only the two pins of the audio jack.

BACKGROUND

Portable two-way radio devices have long been in use and remain a favored communication tool in many realms of activity, such as emergency response, public safety, rescue, as well as some industrial operations. Manufacturers have developed portable two-way radio devices so that they can be used with external audio accessories, such as remote speaker/microphone devices, headphones, and so on. The more sophisticated portable two-way radio devices include an accessory connector that allows the portable two-way radio device to identify the accessory that is connected to it, and route signals accordingly, as well as make appropriate adjustments. In less sophisticated portable two-way radio devices, however, there may be no accessory connector, rather just a simple two wire audio jack into which an external audio accessory can be plugged.

The connectors in an audio jack are designed to route audio signals to an internal speaker when there is no plug in the audio jack, and to disconnect the internal speaker and route signals to an external audio accessory when there is a plug in the audio jack. If there are differences in the audio characteristics of the audio accessory, the user of the portable two-way radio device has to change audio settings to adjust the output of the audio accessory to a desired level.

Accordingly, there is a need for a method and apparatus for detecting the connection of an audio accessory at a two-wire audio jack and changing the audio profile to suit a connected audio accessory.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
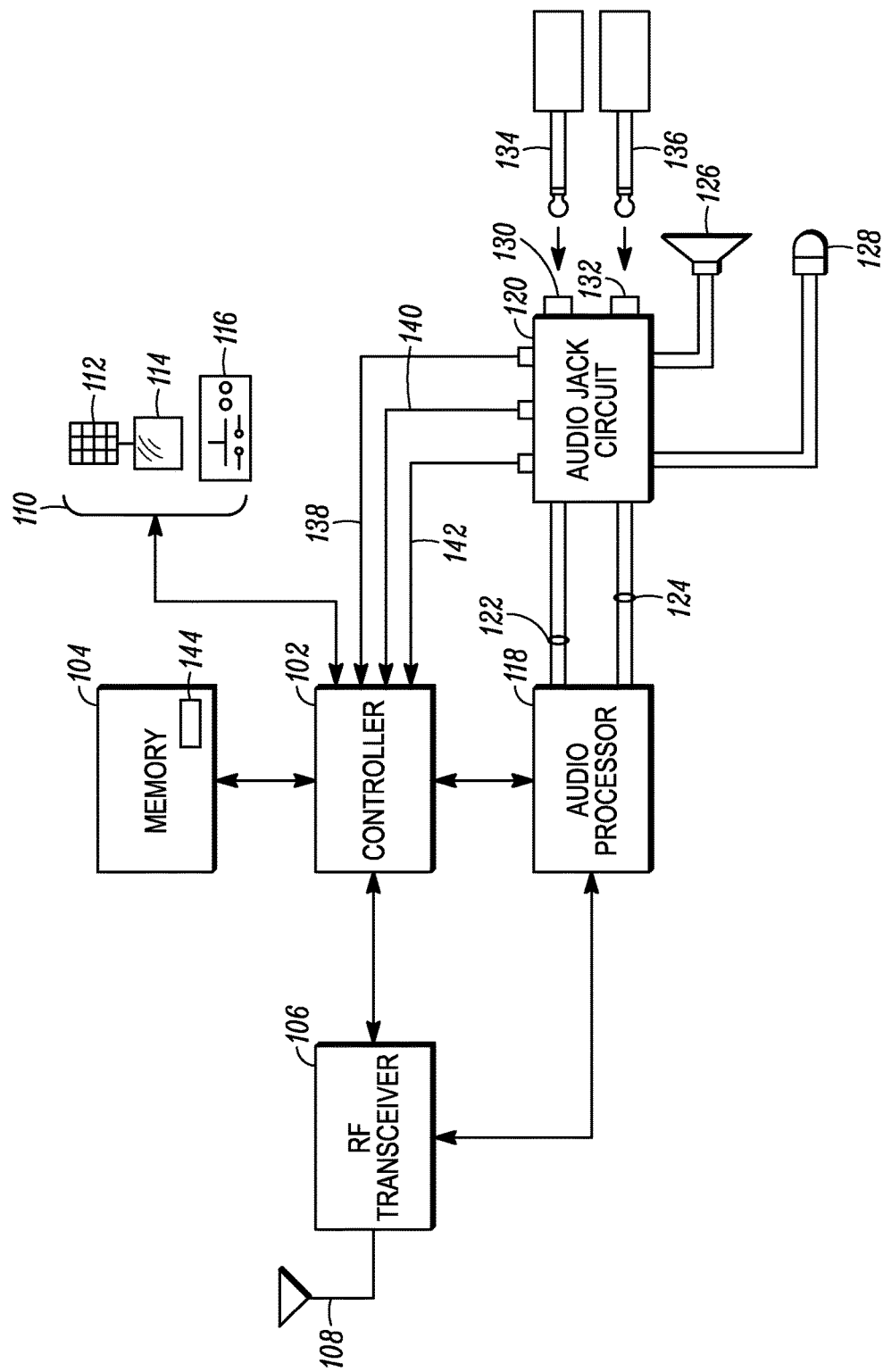
FIG. 1 is a block diagram of a portable two-way radio device in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

The disclosure describes embodiments for a portable two-way radio device that includes an audio power amplifier having an output that has a positive output line and a negative output line. Each of the positive and negative output lines have a direct current (DC) bias on them at the output of the audio power amplifier. The portable two-way radio device further includes an audio jack having a negative pin connected to the negative output line of the audio power amplifier; a break/short pin connected to the positive output line of the audio power amplifier, and an internal routing pin. The internal routing pin is connected to the break/short pin in the absence of an audio plug in the audio jack, and it is disconnected from the break/short pin when an audio plug is inserted into the audio jack. The portable two-way radio device further includes an internal speaker that has a first terminal operatively connected to the negative output line of the audio power amplifier and a second terminal that is operatively connected to the internal routing pin of the audio jack. The first and second terminals each have a DC block that prevents the DC bias at the output of the audio power amplifier from being applied to the internal speaker. The portable two-way radio device further includes a plug detector circuit that samples a DC voltage level of the internal routing pin of the audio jack and provides an output based on the DC voltage level that indicates when the audio plug is present in the audio jack.

FIG. 1 is a block diagram of a portable two-way radio device 100 in accordance with some embodiments. The portable two-way radio device 100 operates using a half-duplex mode of communication where, when a signal is received on a channel monitored by the portable two-way radio device 100, the portable two-way radio device 100 simply plays audio received in the signal over a speaker without requiring any action by the user. Similarly, a user can near-instantly transmit voice signals by pressing a push to talk (PTT) button, which causes the portable two-way radio device 100 to enable a transmitter and commence transmitting. In some cases a portable two-way radio device 100 can first check to see if the channel is available before allowing transmission (typically providing a "talk OK" audible alert).

A controller 102 can provide functional control of the various components and sub-systems of the portable two-way radio device 100, and is coupled to one or more memory devices in memory 104. The controller 102 can be, for example, a microprocessor that can execute instruction code designed in accordance with the teachings herein as well as conventional two-way radio operation. The memory elements 104 can include read only memory (ROM), random access memory (RAM), Flash memory, and other types of memory, as appropriate. The controller is coupled to the radio frequency (RF) transceiver 106 that can transmit and receive radio signals, and which includes the appropriate circuitry and processor capability necessary for filtering, modulation, demodulation, amplification, and so on, as is well known. Several user interface elements 110 allow a user to control and interact with the portable two-way radio device 100, and can include a keypad 112, graphical display 114, and various buttons and knobs 116 (including a push to talk, or PTT button). The RF transceiver 106 uses an antenna 108 to transmit and receive RF signals.

The portable two-way radio device 100 further includes an audio processor 118. The audio processor 118 can be, for example, a digital signal processor, and it converts digital audio signals received from the RF transceiver 106 into analog signals for audio play. Likewise, the audio processor 118 receives analog audio signals and converts them into digital audio signals which are provided to the RF transceiver 106 for transmission. An audio jack circuit 120 facilitates the connection of external audio accessories, and routes audio signals accordingly. The audio processor 118 has differential pair of speaker lines 122 and microphone lines 124 connected to the audio jack. Analog audio signals that are to be played for the user of the portable two-way radio device 100 to hear are routed either to an internal speaker 126 or an external speaker of an audio accessory. Likewise, audio signals that are to be transmitted, such as when the user of the portable two-way radio device 100 presses the PTT button and speaks, can be received from an internal microphone 128 or from an external microphone in an external audio accessory.

Whether signals get routed to or from the internal speaker 126 and microphone 128 or to/from an external audio accessory depends on whether the audio jack circuit 120 indicates an external audio accessory is connected to the portable two-way radio device 100. The audio jack circuit can have one or more audio jacks such as a speaker jack 130 and a microphone jack 132. The jacks 130, 132 are special connectors that receive plugs, such as a speaker plug 134 and a microphone plug 136, respectively. The plugs 134, 136 can be inserted into their corresponding jack 130, 132. When no jack is inserted into the jacks 130, 132, the internal speaker 126 and internal microphone 128 are connected to the speaker lines 122 and microphone lines 124, respectively. When a speaker plug 134 is inserted into the speaker jack 130, the internal speaker 126 is disconnected from the speaker lines 122, and audio signals from the audio processor are played over an external speaker in the external audio accessory, through the speaker plug 134. Likewise, when the microphone plug 136 is inserted into the microphone jack 132 the internal microphone of the portable two-way radio device 100 is disconnected from the microphone lines 124 and the audio processor 118 receives audio signals from an external microphone in an external audio accessory.

The portable two-way radio device 100 can detect the presence of an audio accessory plug (e.g. 134 and/or 136) via a detection signal 138 provided by the audio jack circuit to the controller 102. When the controller 102 detects the detection signal 138 indicating the connection of an external audio accessory, the controller 102 can load an external audio profile 144 from the memory 104 and adjust audio settings of the audio processor 118 in accordance with the audio profile 144. The audio profile 144 can indicate preferred audio settings such as gain compensation, equalizer settings, and so on, to be used with an external audio accessory. The audio settings can include both speaker settings and microphone settings. In some embodiments, given that there can be several different types of audio accessories, there can be several audio profiles such as audio profile 144 stored in the memory 104. In order to determine which external audio accessory is connected, upon the detection signal 138 indicating the connection of an external audio accessory, a current sense signal 140 and a voltage signal 142 can be provided to analog to digital (A/D) converter ports of the controller 102 by the audio jack circuit 120. Upon detection of an external audio accessory, the controller 102 can control the audio processor 118 to generate a series of tones at different frequencies to determine an alternating current (AC) response of the external audio accessory speaker. The AC response can then be mapped to one of several audio profiles, such as audio profile 144, and the settings indicated in the mapped audio profile can then be applied to the audio processor while the external audio accessory is connected to the portable two-way radio device 102.

Figure 2:
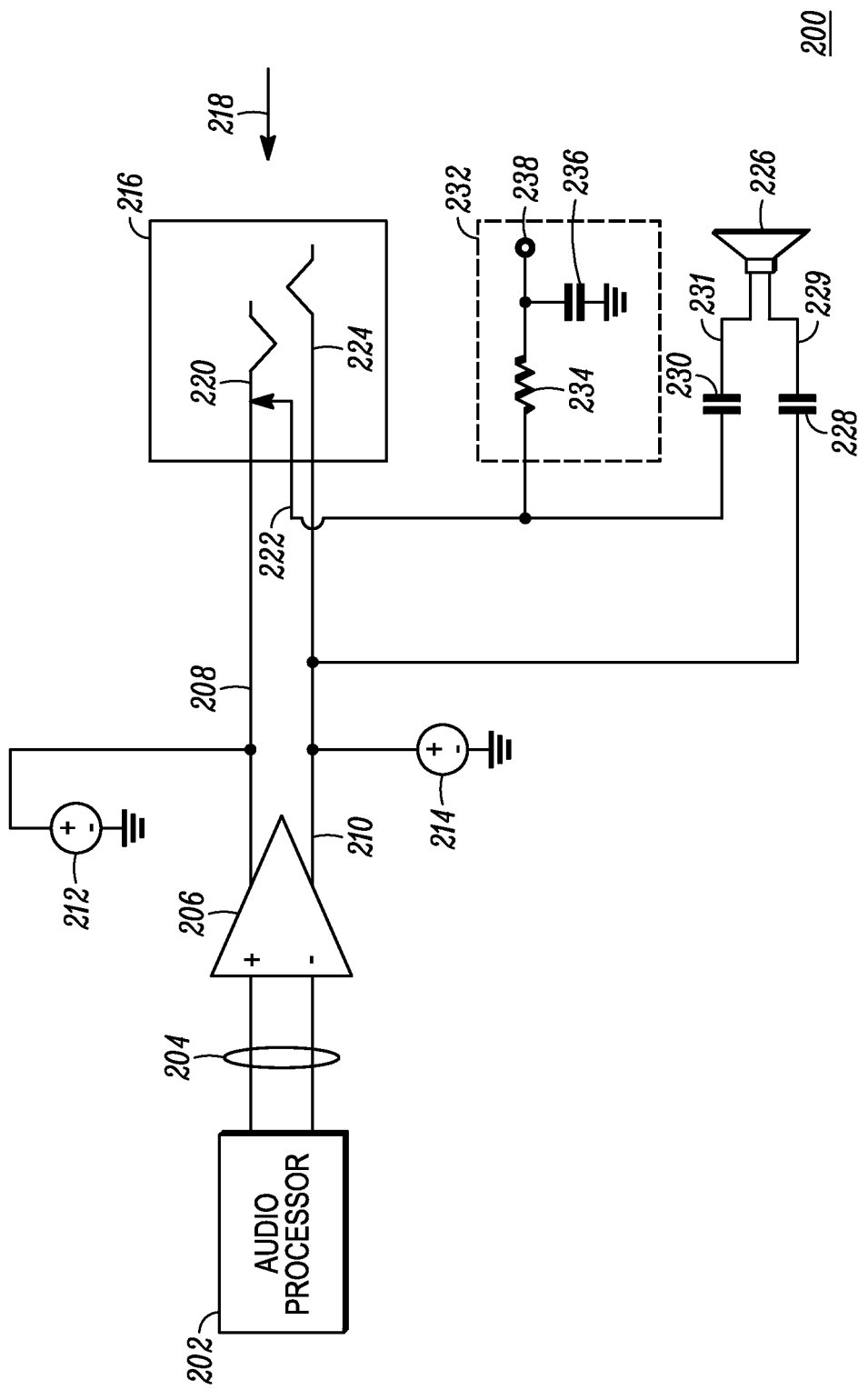
FIG. 2 is a block diagram schematic of an audio accessory detection circuit in accordance with some embodiments.

FIG. 2 is a block diagram schematic of an audio accessory detection circuit 200 in accordance with some embodiments. The audio detection circuit 200 is shown here with elements of the audio processor (e.g. 118) and all elements of the audio jack circuit (e.g. 120). An audio source such as an audio processor 202 can provide audio signals over a pair of conductors 204 to an audio power amplifier 206. As shown here, the audio power amplifier 206 is a differential amplifier and provides an amplified version of the signals on lines 204 over a positive output line 208 and a negative output line 210. Both the positive output line 208 and the negative output line 210 are DC biased to an equal DC level relative to a ground level, as indicated by first DC source 212 and second DC source 214. The positive output line 208 and the negative output line 210 are connected to pins in an audio jack 216, which is configured to receive an audio plug inserted, for example, in the direction of arrow 218. The positive output line 208 is connected to a break/short pin 220 of the audio jack 216. The negative output line 210 is connected to a negative pin 224 of the audio jack 216. Both the break/short pin 220 and the negative pin 224 have features (i.e. a bend or kink) for making physical, and thus electrical contact with corresponding conductors of a plug. The break/short pin 220, being connected to the positive output line 208, has a positive electrical polarity relative to that of the negative pin 224, being connected to the negative output line 210. An internal routing pin 222 makes electrical contact with a conductor of the break/short pin 220 when no plug is inserted into the audio jack. When a plug is inserted into the audio jack 216, the break/short pin 220 can be deflected from contact with the internal routing pin 222, breaking the electrical connection to the internal routing pin 222. Thus, when no audio plug is inserted into the audio jack, the break/short pin 220 will be electrically connected to the internal routing pin 222, which is further connected to a first terminal 231 of an internal speaker 226 through a first DC blocking capacitor 230. The negative output line 210 is connected to a second terminal 229 of the internal speaker 226 through a second DC blocking capacitor 228. The first and second DC blocking capacitors 230, 228 prevent the DC bias 212, 214 from being applied to the internal speaker 226 since the coil of the internal speaker is essentially a DC short circuit. When a plug is inserted into the audio jack 216, the break/short pin 220 is disconnected from the internal routing pin 222, thereby disconnecting the internal speaker 226 from audio signals output by the audio power amplifier 206.

A plug detector circuit 232 can be used to detect the presence of a plug in the audio jack 216. The detector circuit can use, for example, a simple resistor 234 connected to the internal routing pin 222 on one end of the resistor 234, and to a capacitor 236 at the other end of the resistor 234. The capacitor 236 can be grounded. When there is no audio plug in the audio jack, the DC bias on the positive output line 208 will be evident across the capacitor 236 since the internal routing pin 222 will electrically connected to the break/short pin 220. When a plug is inserted into the audio jack 216, the break/short pin 220 will break electrical contact with the internal routing pin 222, then the voltage across the capacitor 236 will drop. The resistor 234 prevents the capacitor 236 from loading the line to the speaker 226 from the internal routing pin 222. The voltage across the capacitor 236 can be provided as a detection signal 238 to a controller of the portable two-way radio device, similar to detection signal 138 of FIG. 1. Thus, the presence or absence of the a plug in the audio jack 216 can be detected by the portable two-way radio device based on the level of voltage of the detection signal 238. Upon detecting an external audio accessory by the presence of a plug in the audio jack the portable two-way radio device can adjust audio settings in the audio processor 202 and/or the audio power amplifier 206 in accordance with an external audio accessory profile.

Figure 3:
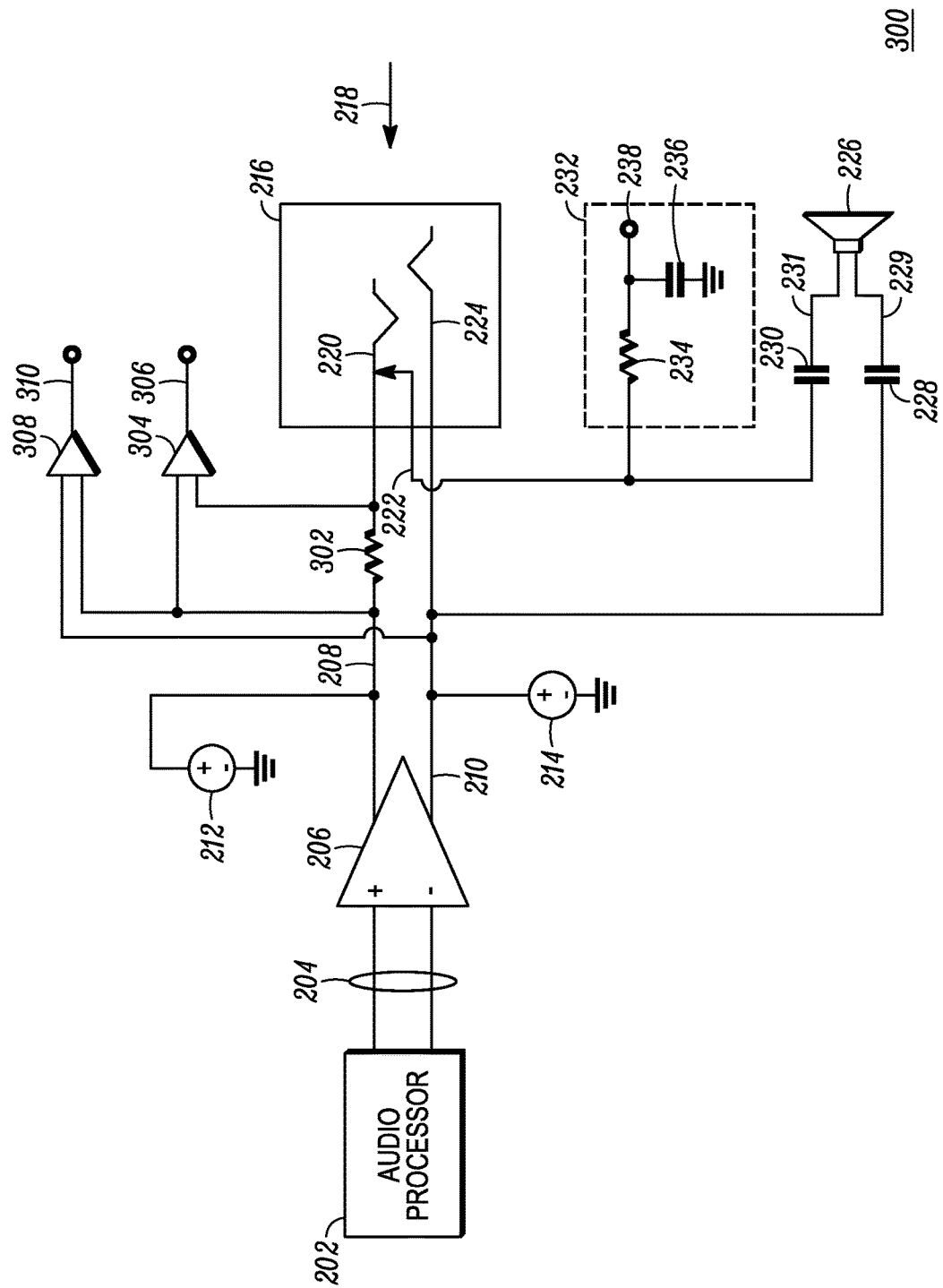
FIG. 3 is a block diagram schematic of an audio accessory detection circuit in accordance with some embodiments.

FIG. 3 is a block diagram schematic of an audio accessory detection circuit 300 in accordance with some embodiments. The audio detection circuit 300 includes all the elements of that shown in FIG. 2. Where the audio detection circuit of FIG. 2 is capable of detecting the connection (or disconnection) of an audio accessory, audio accessory detection circuit 300 provides the additional capability of determining which of several difference external audio accessories are connected when an audio accessory is detected at the audio jack 216. In some embodiments there can be a number of external audio accessories that can be used with the portable two-way radio device. To characterize a connected external audio accessory, a current sense resistance 302 can be placed in series on the positive output line 208 between the audio power amplifier and the break/short pin 220. The current sense resistance 302 produces a current sense voltage in response to current through the current sense resistance 302. The current sense voltage can be amplified by a current sense amplifier 304 to produce a current sense signal 306, which can be equivalent to current sense signal 140 of FIG. 1. The voltage differential between the positive output line 208 and the negative output line 210 can be sensed by a voltage sense amplifier 308 to produce a voltage sense signal 310, which can be substantially equivalent to voltage sense 142 of FIG. 1.

Upon detection of an external audio accessory, when a plug is inserted into the audio jack 216, the audio processor 202 can generate several tones at different frequencies to detect the current and voltage response of the external audio accessory using the current sense signal 306 and the voltage sense signal 310. The impedance of the external audio accessory at a given frequency is equal to the ration of the output voltage of the audio power divided by the current minus the resistance of the current sense resistor 302. That is:

$$Z_{freq} = [V_{total}/(V_{sense}/R_{sense})] - R_{sense}.$$

Where $Z_{freq}$ is the impedance at a given frequency, $V_{total}$ is the total voltage output by the audio power amplifier between the positive output line and the negative output line, and $R_{sense}$ is the resistance of the sense resistor 302. By sweeping the audio power amplifier 206 output at different frequencies, the portable two-way radio device can determine a fundamental frequency, quality factor, and resistance of the external audio accessory, and use these parameters to map to one of several audio profiles. The fundamental frequency of the external audio accessory occurs at the frequency at which the audio accessory has the lowest impedance. The quality factor is a measure of bandwidth at a preselected level from the peak response of the fundamental frequency, and is typically −3 decibels (dB) from the peak response. Once an audio profile that corresponds to the electrical characteristics is determined, then audio settings associated with the audio profile can be used to adjust the audio processor 202 and the audio power amplifier correspondingly.

Figure 4:
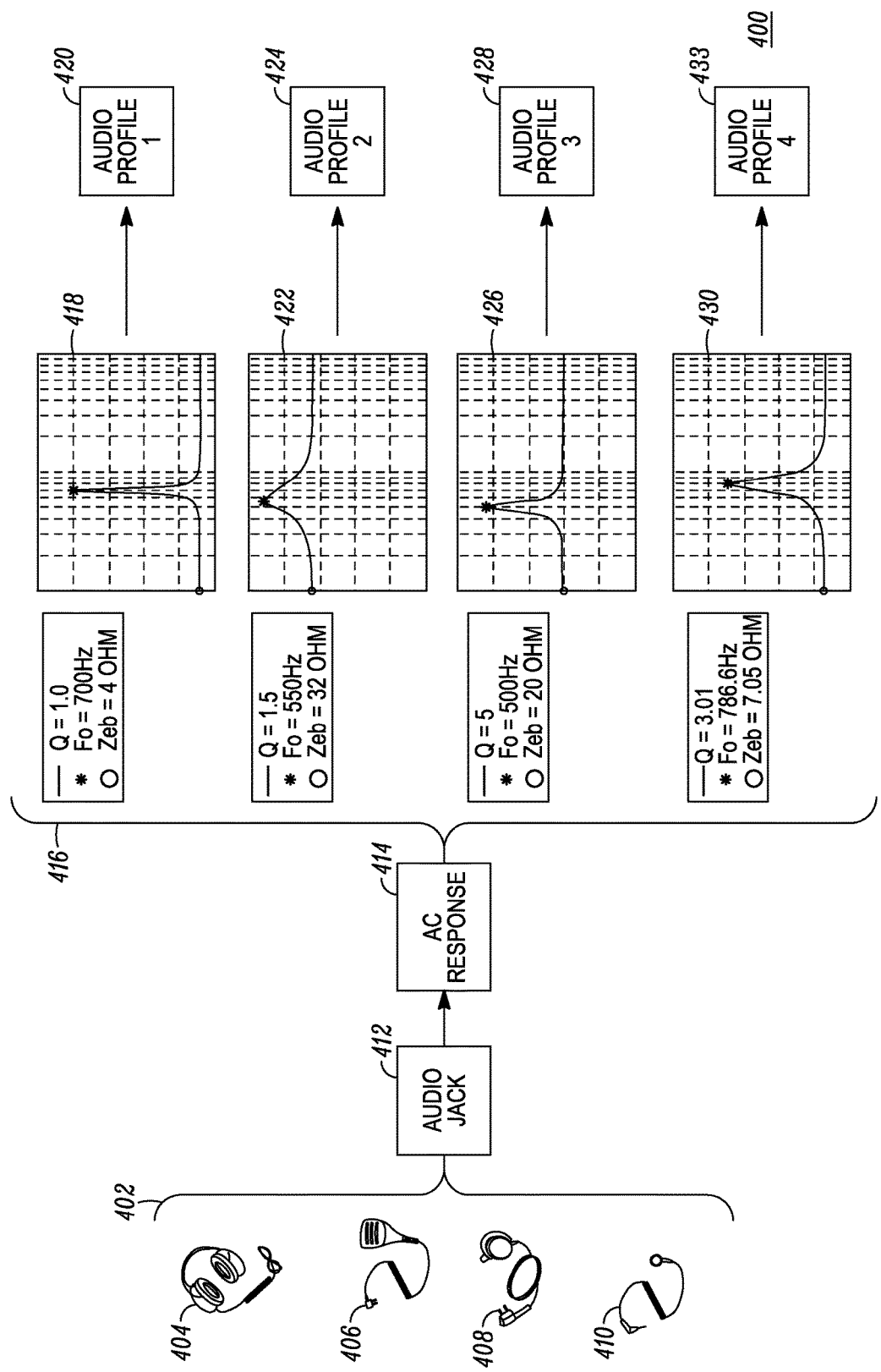
FIG. 4 is a mapping diagram for selecting an audio profile based on identifying a connected audio accessory at a two-wire audio connector in accordance with some embodiments.

FIG. 4 is a mapping diagram 400 for selecting an audio profile based on identifying a connected audio accessory at a two-wire audio connector in accordance with some embodiments. The mapping diagram represents a process used by a portable two-way radio device or other audio device using an audio detection circuit such as that shown, for example, in FIG. 3. A plurality of external audio accessories 402 can include a headset 404, a remote speaker-microphone accessory 406, a head-mounted speaker-microphone accessory 408, and an earbud 410. Numerous other configurations of external audio accessories can exist as well. One of the plurality of external audio accessories 402 is plugged into an audio jack 412 of the portable two-way radio device (or other audio device). As a result, the portable two-way radio device detects the connection using, for example, the detection circuit 232 and detection signal 238 of FIGS. 2-3. The portable two-way radio device then, in response to detecting the connection of the audio accessory to the portable two-way radio device at the audio jack 412, sweeps several tones or a range of tones applied to the external audio accessory through the audio jack 412. The plurality of external audio accessories 402 can each be electrically characterized (prior to the detection method) by the AC response block 414 to produce a statistical profile. As a result of the tone sweep and impedance determination at each frequency, various responses 416 are produced, depending on which external audio accessory is connected. Thus, headset 404 can produce response 418, remote speaker-microphone accessory 406 can produce response 422, head-mounted speaker-microphone accessory 408 can produce response 426, and earbud 410 can produce response 430. Each of the responses can be processed to determine several electrical characteristics, such as a fundamental frequency (i.e. the frequency where the most power is transferred to the external audio accessory from the audio power amplifier), and a quality factor. Each external audio accessory can be statistically characterized beforehand, so that each response 416 can be mapped to one of several profiles 420, 424, 428, and 433 (respectively corresponding to responses 418, 422, 426, and 430). Each audio profile 420, 424, 428, and 433 can indicate, for example various equalizer settings, gain settings, and other audio settings to be used while the corresponding external audio accessory is connected to the portable two-way radio device.

Figure 5:
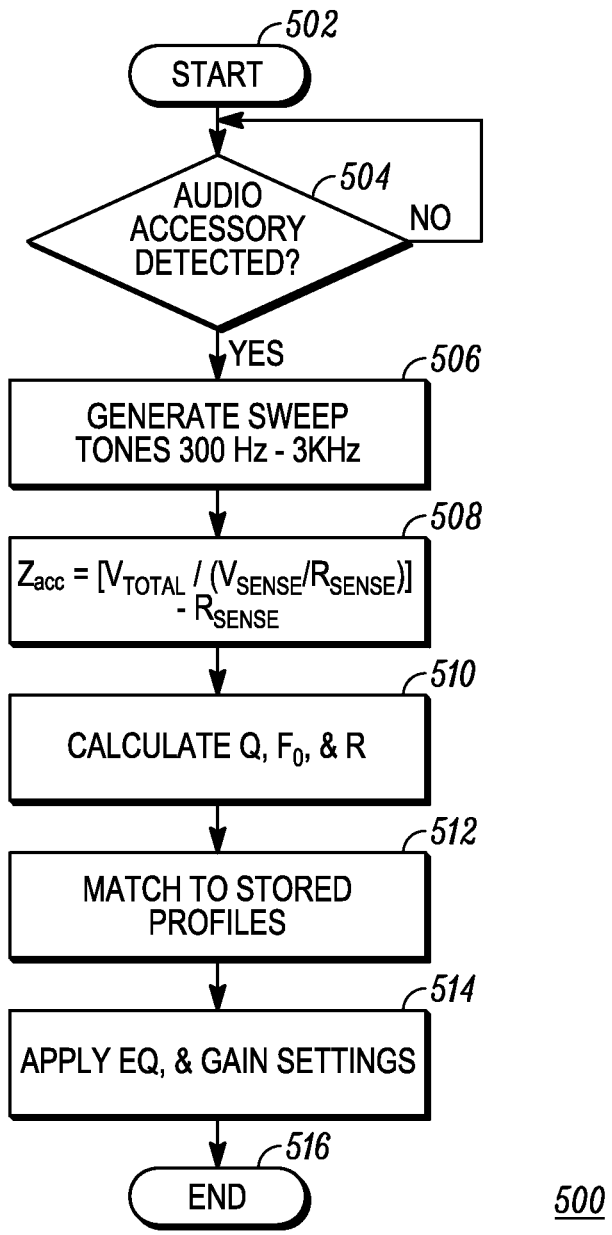
FIG. 5 is a flowchart diagram of a method for detecting and identifying a connected audio accessory at a two-wire audio connector in accordance with some embodiments.

FIG. 5 is a flowchart diagram of a method 500 for detecting and identifying a connected audio accessory at a two-wire audio connector in accordance with some embodiments. In particular, the method 500 can be representative of the process implied in FIG. 4 where an audio device detects the connection of an external audio accessory, and then characterizes AC response of the external audio accessory. At the start 502, the audio device, such as a portable two-way radio device, is turned on and ready to carry out the method and various detection processes. Thus, in step 504, the method waits until an external audio accessory is connected. During this time the audio device may be playing audio over an internal speaker of the audio device. When an external audio device is connected to the audio device and detected, the method proceeds to step 506 where the AC response determination commences. In step 506, tonal audio content is applied to the external audio device, which can be accomplished by a sweep of frequencies. In step 508, an impedance is determined at several various frequencies sufficient to determine, in step 510, various electrical characteristics such as the quality factor and the fundamental frequency of the external audio accessory. In step 512 the various determined AC response parameters are mapped or matched to one of several profiles. The profiles can be expressed as a statistical composite of the external audio device to which the profile corresponds. Each profile is generated a priori by, for example, testing several examples of the audio accessory to determine a range of values for each AC parameter being tested. For each external audio accessory type for which a profile is generated, various audio settings can be determined to optimize the performance of the external audio accessory, such as equalizer settings and overall gain, and these settings can be stored in correspondence with the profile. Thus, in step 514, the audio settings corresponding to the profile determined in step 512 can be applied to the audio components, such as, for example, an audio processor and/or the audio power amplifier. The method then ends 516 with the audio components configured to optimize the audio performance of the connected audio accessory. Although shown ending in step 516, it will be appreciated by those skilled in the art that, just as the connection of the external audio accessory can be detected, the disconnection of the external audio accessory can likewise be detected. When the external audio accessory is disconnected, the default audio settings for the internal speaker can be applied to the audio components.

Accordingly, the various embodiments provide the benefit of allowing an audio device, such as a portable two-way radio device, to detect the connection of an external audio accessory over a two-wire audio jack. Furthermore, in some embodiments, the connected external audio accessory can be identified so that a set of audio settings can be applied to optimize the performance of the external audio accessory. When the external audio accessory is removed, the default audio settings are re-applied to optimize the audio performance of the internal speaker.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A method for identifying an audio accessory through a two-wire audio jack, comprising:
    biasing a positive output line and a negative output line of an audio power amplifier with a direct current (DC) bias voltage, the negative output line being connected to a negative pin of an audio jack, the positive output line being connected to a break/short pin of the audio jack, and wherein the audio jack has an internal routing pin that is connected to the break/short pin in the absence of an audio plug in the audio jack and that is disconnected from the break/short pin when the audio plug is inserted into the audio jack;
    detecting removal of the DC bias voltage from the internal routing pin;
    selecting an audio profile for an external audio accessory responsive to detecting removal of the DC bias voltage from the internal routing pin;
    reconfiguring audio settings of an audio processor that provides an audio signal to the audio power amplifier in accordance with the selected audio profile;
    wherein selecting the audio profile comprises determining an alternating current (AC) response of the external audio accessory to determine a plurality of parameters comprising: impedance, quality factor and fundamental frequency and mapping the AC response to the audio profile which is one of a plurality of audio profiles based on the plurality of parameters;
    wherein determining the AC response comprises applying tonal audio content to the external audio accessory and detecting a current and a voltage response at each of a plurality of tones, the current being sensed by a current sense resistance in series between the audio positive output line of the audio power amplifier and the break/short pin as part of an impedance measurement; and
    wherein the impedance measurement of the external audio accessory at a given frequency is equal to the ratio of the output voltage of the audio power divided by the current minus the resistance of the current sense resistance:

$Z_{freq}=[V_{total}/(V_{sense}/R_{sense})]-R_{sense}$, where $Z_{freq}$ is the impedance at a given frequency, $V_{total}$ is total voltage output by the audio power amplifier between the audio positive output line and the negative output line, and $R_{sense}$ is resistance of the current sense resistance.

2. The method of claim 1, further comprising, subsequent to reconfiguring audio settings, detecting removal of the external audio accessory and, in response, reconfiguring audio settings of the audio processor to default audio settings for an internal speaker.

3. The method of claim 1, wherein detecting removal of the DC bias voltage from the internal routing pin comprises detecting the voltage across a grounded capacitor that is connected to the internal routing pin through a resistance.

4. A method of adjusting audio output of an audio device, comprising:
    detecting connection of an external audio accessory at a two-wire audio jack of the audio device, the audio jack including a break/short pin coupled to a positive output line of an audio power amplifier, a negative output pin coupled to a negative output line of the audio power amplifier, and an internal routing pin that is connected to the break/short pin in the absence of a plug in the audio jack and disconnected from the break/short pin when a plug is inserted in the audio jack, detecting connection of the external audio device is based on a change of an electrical parameter on the internal routing pin;
    selecting a set of audio settings of an audio processor in response to detecting connection of the external audio accessory;
    applying the audio settings to at least one audio component of the audio device, wherein the audio settings are selected to optimize audio performance of the external audio accessory;
    wherein selecting the set of audio settings comprises:
    determining an alternating current (AC) response of the external audio accessory;
    determining a plurality of parameters comprising: impedance, quality factor and fundamental frequency from the AC response of the external audio accessory; and
    mapping the AC response to one of a plurality of audio profiles that corresponds to the AC response based on the plurality of parameters;
        wherein determining the AC response comprises applying tonal audio content to the external audio accessory and detecting a current and a voltage response at each of a plurality of tones, the current being sensed by a current sense resistance in series on the positive output line between the audio power amplifier and the break/short pin as part of an impedance measurement; and
        wherein the impedance measurement of the external audio accessory at a given frequency is equal to the ratio of the output voltage of the audio power divided by the current minus the resistance of the current sense resistance:

$Z_{freq}=[V_{total}/(V_{sense}/R_{sense})]-R_{sense}$, where $Z_{freq}$ is the impedance at a given frequency, $V_{total}$ is total voltage output by the audio power amplifier between the audio positive output line and the negative output line, and $R_{sense}$ is resistance of the current sense resistance.

5. The method of claim 4, further comprising, subsequent to applying the audio settings, detecting removal of the external audio accessory and, in response, reconfiguring audio settings of the audio processor to default audio settings for an internal speaker.

6. The method of claim 1, wherein the two-wire audio jack comprises a speaker jack and a microphone jack for insertion of a two-pin external audio accessory.

7. The method of claim 1, wherein the audio profile indicates preferred audio settings comprising one or more of: gain compensation and equalizer settings to be used with the external audio accessory.

8. The method of claim 1, wherein the audio profile is selected from a memory of a portable two-way radio.

9. The method of claim 4, wherein the plurality of audio profiles are stored in a memory of the audio device.

* * * * *